(12) United States Patent
Takeuchi et al.

(10) Patent No.: US 6,727,171 B2
(45) Date of Patent: Apr. 27, 2004

(54) DIAMOND PN JUNCTION DIODE AND METHOD FOR THE FABRICATION THEREOF

(76) Inventors: Daisuke Takeuchi, c/o Electrotechinical Laboratory, Agency of Industrial Science & Technology, 1-4 Umezono 1-Chome, Tsukuba-shi, Ibaraki (JP); Hideyuki Watanabe, c/o Electrotechinical Laboratory, Agency of Industrial Science & Technology, 1-4 Umezono 1-Chome, Tsukuba-shi, Ibaraki (JP); Hideyo Okushi, c/o Electrotechinical Laboratory, Agency of Industrial Science & Technology, 1-4 Umezono 1-Chome, Tsukuba-shi, Ibaraki (JP); Masataka Hasegawa, c/o Electrotechinical Laboratory, Agency of Industrial Science & Technology, 1-4 Umezono 1-Chome, Tsukuba-shi, Ibaraki (JP); Masahiko Ogura, c/o Electrotechinical Laboratory, Agency of Industrial Science & Technology, 1-4 Umezono 1-Chome, Tsukuba-shi, Ibaraki (JP); Naoto Kobayashi, c/o Electrotechinical Laboratory, Agency of Industrial Science & Technology, 1-4 Umezono 1-Chome, Tsukuba-shi, Ibaraki (JP); Koji Kajimura, c/o Electrotechinical Laboratory, Agency of Industrial Science & Technology, 1-4 Umezono 1-Chome, Tsukuba-shi, Ibaraki (JP); Sadanori Yamanaka, c/o Japan Science and Technology Corporation, Bldg., 4-1-8, Hon-cho Kawaguchi, Saitama (JP)

( * ) Notice: Subject to any disclaimer, the term of this patent is extended or adjusted under 35 U.S.C. 154(b) by 0 days.

(21) Appl. No.: 10/368,482

(22) Filed: Feb. 20, 2003

(65) Prior Publication Data

US 2003/0155654 A1 Aug. 21, 2003

Related U.S. Application Data (63) Continuation of application No. 09/651,022, filed on Aug. 30, 2000.

(30) Foreign Application Priority Data

Aug. 31, 1999 (JP) .............................. 11-244883

(51) Int. Cl.$^7$ .......................................... H01L 21/4763
(52) U.S. Cl. ..................... 438/624; 257/77; 257/104; 257/655; 257/656
(58) Field of Search .................... 257/77, 104, 655, 257/656

(56) References Cited

U.S. PATENT DOCUMENTS 5,600,156 A * 2/1997 Nishibayashi et al. ........ 257/77

\* cited by examiner

*Primary Examiner*—David Nelms
*Assistant Examiner*—Mai-Huong Tran (57) ABSTRACT

A diamond pn junction diode includes a p-type diamond thin-film layer formed on a substrate and an n-type diamond thin-film layer formed by forming a high-quality undoped diamond thin-film layer on the p-type diamond thin-film layer and ion-implanting an impurity into the high-quality undoped diamond thin-film layer, or alternatively includes an n-type diamond thin-film layer formed on a substrate and a p-type diamond thin-film layer formed by forming a high-quality undoped diamond thin-film layer on the n-type diamond thin-film layer and ion-implanting an impurity into the high-quality undoped diamond thin-film layer. A method of fabricating a diamond pn junction diode includes the steps of forming a p-type diamond thin-film layer on a substrate, forming a high-quality undoped diamond thin-film layer on the p-type diamond thin-film layer, and making the high-quality undoped diamond thin-film layer an n-type diamond thin-film layer by ion implantation of an impurity, or alternatively includes the steps of forming an n-type diamond thin-film layer on a substrate, forming a high-quality undoped diamond thin-film layer on the n-type diamond thin-film layer, and making the high-quality undoped diamond thin-film layer a p-type diamond thin-film layer by ion implantation of an impurity.

4 Claims, 8 Drawing Sheets

DIAMOND PN JUNCTION DIODE AND METHOD FOR THE FABRICATION THEREOF

BACKGROUND OF THE INVENTION

1. Field of the Invention

This invention relates to a diamond pn junction diode and a method for fabrication thereof.

2. Description of the Prior Art

Diamond has superior physical and chemical characteristics as a wide-band gap semiconductor and can operate at temperatures as high as 1000° C. as opposed to silicon (Si), which can only be used at temperatures below 200° C. In the application of diamond, with its superior characteristics, to electronic devices, basically a p-type semiconductor and n-type semiconductor are formed as the foundation and then a diamond pn junction diode is formed.

However, particularly from the viewpoint of device application, technology must be developed that will control the electrical conductivity (p-type, n-type) using ion implantation and that will join the p-type semiconductor and n-type semiconductor, but compared to silicon (Si), almost no viable applications such as an ion implantation method have been realized.

This invention was proposed to address this problem and its purpose is to offer a diamond pn junction diode and its fabrication method to serve as a basis for allowing the application of diamond semiconductor as an electronic device by employing an ion implantation method.

SUMMARY OF THE INVENTION

To achieve the above objective, the diamond pn junction diode of this invention is fabricated by forming a p-type diamond thin-film layer on a substrate and a high-quality undoped diamond thin-film layer on this p-type diamond thin-film layer, and then making the above formed thin-film layer an n-type diamond thin-film layer by ion implantation of an impurity.

The above p-type diamond thin-film layer also includes a thin-film layer in which a high-quality undoped diamond thin-film layer is formed on a substrate and this formed diamond thin-film layer is doped with an impurity.

Further, the diamond pn junction diode of this invention comprises an n-type diamond thin-film layer formed on a substrate and a high-quality undoped diamond thin-film layer formed on this n-type diamond thin-film layer, which is then made a p-type diamond thin-film layer by ion implantation of an impurity on the formed thin-film layer.

The above n-type diamond thin-film layer also includes a thin-film layer in which a high-quality undoped diamond thin-film layer is formed on a substrate and this formed thin-film layer is doped with an impurity.

The above p-type thin-film layer includes a layer wherein the substrate on which it is formed is a p-type and a p-type diamond thin-film layer in which the hole density is lower than the hole density in the substrate.

Further, the above n-type thin-film layer includes a layer wherein the substrate on which it is formed is an n-type and an n-type diamond thin-film layer wherein the electron density is lower than the electron density of the substrate.

Further, the above high-quality undoped diamond thin-film layer includes a layer of sufficiently high quality that it emits intrinsic ultraviolet light at room temperature by any excitation method such as the electron injection one when the film thickness is at least 200 nm.

When the above p-type diamond thin-film layer surface and n-type diamond thin-film layer surface become the top layer in a lamination, that surface is made a graphite low-resistance layer by ion implantation and an electrode is formed on this graphite low-resistance layer.

The diamond pn junction diode fabrication method of this invention makes a diamond pn junction diode by forming a p-type diamond thin-film layer on the above substrate, forming a high-quality undoped diamond thin-film layer on the formed diamond thin-film layer, and making this formed diamond thin-film layer an n-type diamond thin-film layer by ion implantation of an impurity.

The diamond pn junction diode fabrication method of this invention makes a diamond pn junction diode by forming an n-type diamond thin-film layer on the above substrate, forming a high-quality undoped diamond thin-film layer on the formed diamond thin-film layer, and making this formed diamond thin-film layer a p-type diamond thin-film layer by ion implantation of an impurity.

In the above diamond pn junction diode fabrication method, the above high-quality undoped diamond thin-film layer includes a thin-film layer of sufficiently high quality to emit intrinsic ultraviolet light at room temperature by any excitation method such as the electron injection one when its film thickness is at least 200 nm.

As described above, by means of the diamond pn junction diode and its fabrication method of this invention, it is possible to reliably control the electrical conductivity of diamond by ion implantation, which had not been realized in most cases in the prior art, by ion implantation of an impurity on a high-quality undoped diamond thin-film layer, and since we were able to join diamond thin-film layers that demonstrate remarkable p-type and n-type characteristics through control of the electrical conductivity, it is possible to reliably fabricate diamond pn junction diodes which could not be realized in the prior art.

The above and other objects and features of the invention will become apparent from the following description made with reference to the drawings.

DESCRIPTION OF THE PREFERRED EMBODIMENTS

Figure 1:
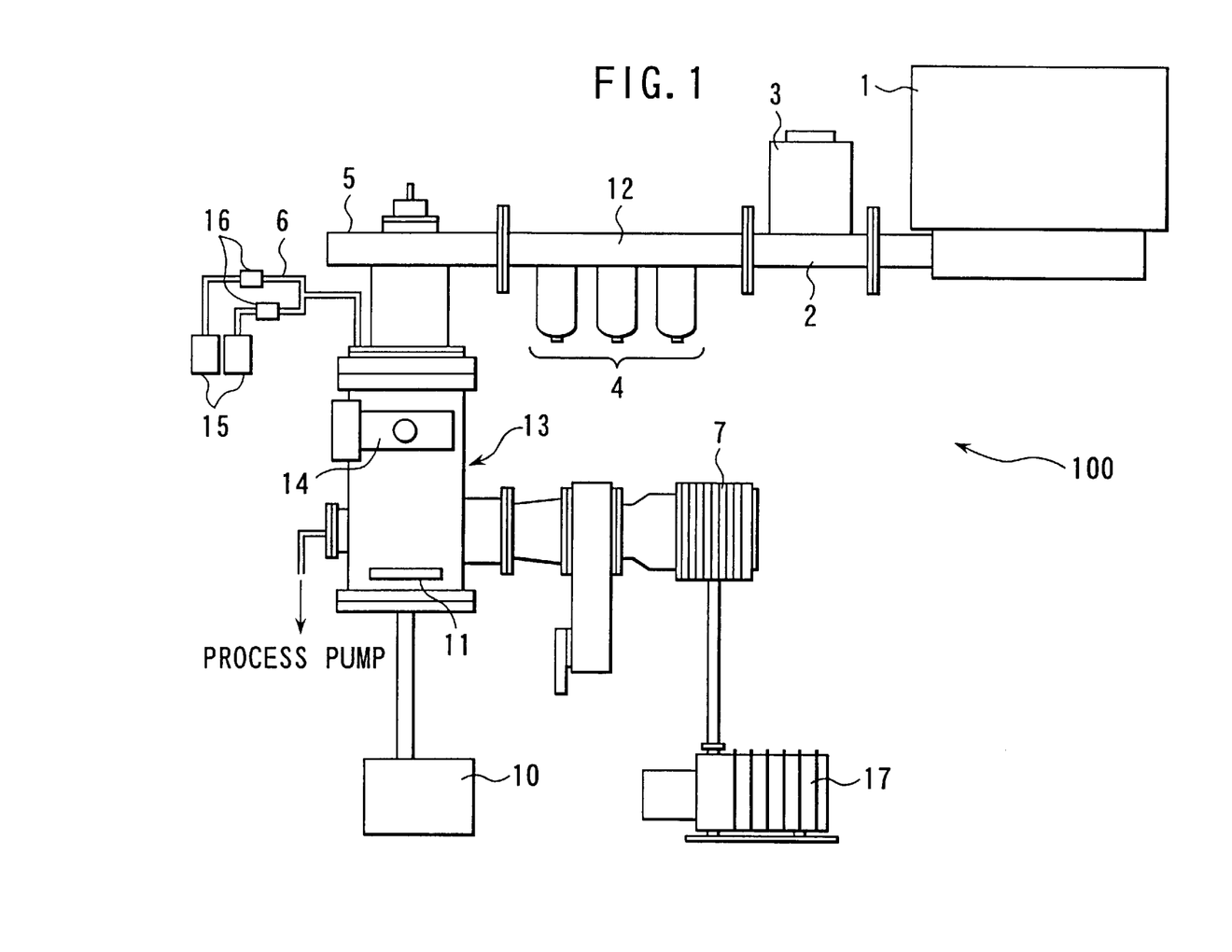
FIG. 1 is a schematic diagram of the microwave plasma CVD apparatus used in the fabrication of the diamond pn junction diode of this invention.

FIG. 1 is a schematic diagram showing the configuration of a microwave plasma CVD apparatus used in the fabrication of the diamond pn junction diode. of this invention. In the figure, a microwave plasma CVD apparatus 100 is an end-launch type in which the microwaves enter a substrate 11 from the normal direction, and a microwave source 1 generates a 2.45 GHz microwave, has a maximum output of 1.5 kW, and its output can be adjusted as required. The latter stage of the microwave source 1 has a circulator 2 and dummy load 3, whereby the reflected waves of the microwaves emitted from the microwave source 1 that are reflected and return back to a wave guide 12 are heat absorbed as a water load to prevent reflected waves from having any adverse effects on the oscillator of the microwave source 1. Further, a tuner 4 is disposed in the latter stage of the circulator 2 to allow adjustment of the impedance of the wave guide 12 using three rods in order to suppress the reflection of microwaves so that all injected power is consumed in the plasma. Further, the latter stage of the tuner 4 is equipped with an applicator 5 that has an antenna protruding into the wave guide which converts the TE10 mode microwaves propagated through the wave guide 12 to concentric TM01 mode microwaves. Converting the microwaves to TM01 mode matches them to a cylindrical reactor 13 so that a stable plasma can be obtained.

The source gas is a mixed gas comprising methane gas as the carbon source, hydrogen gas, and an impurity doping gas, which is supplied as required, and these gases are led from their respective gas cylinders 15, through a reducing valve (not shown) and mass-flow controller, to the reactor 13 from a gas injection pipe 6. A mass-flow controller 16 for the methane gas is a high precision-type to ensure a mix ratio of less than 0.5% (ratio of methane gas to hydrogen gas).

A process pump is used to exhaust gas during the CVD diamond synthesis process in order to maintain an extremely clean vacuum environment in the reactor 13 during diamond synthesis by plasma CVD. A turbo pump 7 is used to achieve a high vacuum in advance, after which a rotary pump 17 is used to exhaust during synthesis, and a high-frequency heater is used to control the temperature of the substrate 11. A sample replacement door 14 is opened and the substrate 11 is set in a prescribed location in the reactor 13.

The diamond thin-film layer is fabricated in the above microwave plasma CVD apparatus with a low concentration of methane gas, and film quality of the fabricated diamond thin-film layer was evaluated using cathode luminescence (CL).

Figure 2:
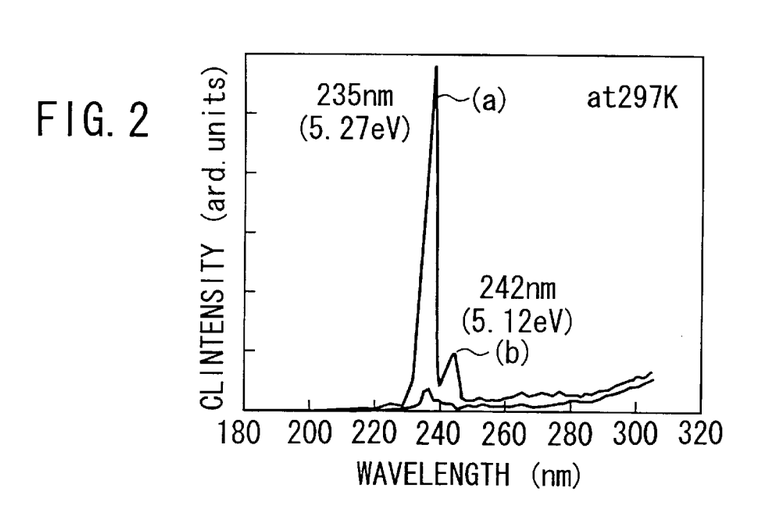
FIG. 2 is a graph showing the CL spectrum in the ultraviolet light range of a diamond thin-film layer fabricated with low and normal methane gas concentrations.

FIG. 2 is a graph showing the CL spectra in the ultraviolet light range for diamond thin-film layers fabricated with low and normal concentrations of methane gas, i.e. the emission intensity of diamond thin-film layers excited by irradiation of electron beams. In the figure, (a) indicates the CL spectrum of a diamond thin-film layer synthesized over 42 hours at a methane gas concentration of 0.025%, a substrate temperature of 800° C., a pressure of 25 Torr, and a microwave output of 750 W, and (b) indicates the spectrum of a diamond thin-film layer synthesized for 6 hours under the same conditions except with a methane gas concentration of 6.0%.

In the diamond thin-film layer (a), the CL strength is notably high at a wavelength of 235 nm, and the luminescence at this wavelength of 235 nm is a 5.27 eV ultraviolet luminescence resulting from free exciton recombination of the diamond. That is, the diamond thin-film layer (a) demonstrates a remarkable band-edge luminescence specific to diamond at room temperature. The diamond thin-film layer (b), on the other hand, contains impurities, defects, etc., in the film which cause a recombination center to appear that prevents luminescence in the band gap, and therefore almost no band-edge luminescence is obtained. In view of this result, we found that a diamond thin-film layer fabricated with a low methane gas concentration results in an extremely good (high quality) film structure. There have been reports of band-edge luminescence from this kind of diamond thin film at temperatures below that of liquid nitrogen, but as far as we know, this is the first observation made at room temperature (Applied Physics Letters, Vol. 73, No. 7, pp. 981–983 (1998)).

The diamond thin-film layer used in this invention is of sufficiently high quality to emit ultraviolet light at room temperature by excitation with electron beams was explained above, but if the film thickness is thin, e.g., less than 200 nm, the ultraviolet light may not be observed at room temperature even if the diamond thin-film layer is of the same high quality and is excited with electron beams. However, this invention also includes high-quality diamond thin-film layers in which ultraviolet light emission is not observed at room temperature because the film thickness is too thin.

Figure 3:
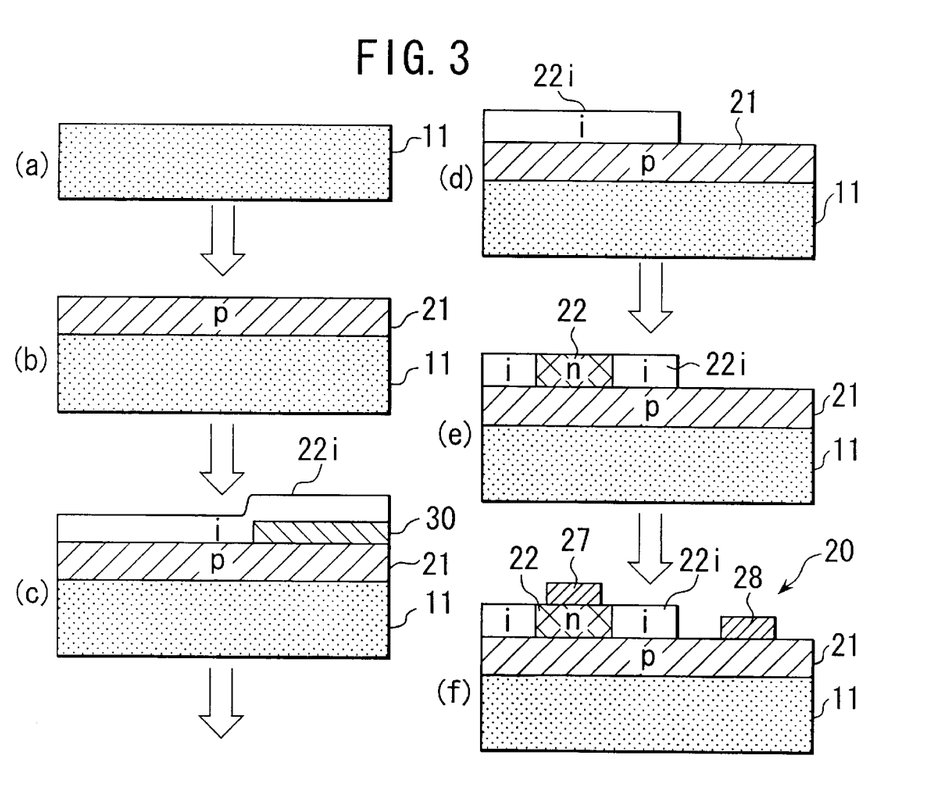
FIG. 3 is a drawing showing the first embodiment of the fabrication process of the diamond pn junction diode of this invention.

FIG. 3 is a drawing showing the first embodiment of the fabrication process of the diamond pn junction diode of this invention. The diamond pn junction diode 20 of this invention is fabricated by the following procedure using the microwave plasma CVD device 100 described above. The diamond thin-film layers 21 and 22i formed on the substrate 11 are both synthesized under a low methane gas concentration in the reactor 13 in which an extremely clean vacuum environment is maintained, and they are of sufficiently high quality that they emit ultraviolet light at room temperature by excitation with electron beams when their film thickness is greater than 200 nm.

First, in step (1), the substrate 11 is set in the reactor 13. This substrate 11 is, for example, a diamond Ib(001) insulation substrate artificially synthesized under a high temperature and pressure (FIG. 3(a)).

Next, in step (2), a boron-doped p-type diamond thin-film layer 21 is synthesized on the substrate 11 by a CVD method using trimethylboron as the boron source (FIG. 3(b)).

In step (3), a p-type diamond thin-film layer 21 is partially covered by a mask 30, and then a high-quality undoped diamond thin-film layer 22i is synthesized on the p-type diamond thin-film layer 21 and mask 30 (FIG. 3(c)). As an example of the synthesis of the above thin-film layer 22i, a substrate temperature of 800° C., a pressure of 25 Torr, a microwave output of 750 W, a methane gas concentration of 0.025%, and a synthesis time of 42 hours may be used.

In step (4), the mask 30 is removed and the undoped diamond thin-film layer 22i on top of that is removed, thus exposing the p-type diamond thin-film layer 21 (FIG. 3(d)).

In step (5), the substrate 11 is removed from the reactor 13, and then by means of multiple ion implantation, the middle part of the undoped diamond thin-film layer 22i is implanted with sulfur (S) until the implantation reaches the boundary with the p-type diamond thin-film layer 21 while leaving the periphery alone, thus forming an n-type diamond thin-film layer 22.

In an example of the above sulfur ion implantation, the sample temperature is 400° C. and the diamond thin-film layer 22 is implanted with sulfur ions under the ion implantation conditions in TABLE 1 below such that the sulfur ion concentration becomes $1 \times 10^{20}/cm^3$ at a depth ranging from 30 nm to 270 nm.

TABLE 1

| Energy (keV) | Dose ($10^{14}/cm^2$) |
|---|---|
| 62 | 1.3 |
| 75 | 1.3 |
| 100 | 2.4 |
| 150 | 3.0 |
| 200 | 2.7 |
| 250 | 3.6 |
| 300 | 1.7 |
| 350 | 4.6 |
| 400 | 4.5 |
| Total | $2.5 \times 10^{15}/cm^2$ |

By this means, a pn junction is formed between this layer and the p-type diamond thin-film layer 21 below it, thus forming a diamond pn junction diode 20 on the substrate 11. Further, a graphite low-resistance layer is formed by graphite conversion of the uppermost surface of the n-type diamond thin-film layer 22 to a depth of about 30nm by argon ion implantation at 40 keV in a dose of $1 \times 10^{16}/cm^{-2}$ (FIG. 3(e)).

In step (6), an electrode 27 formed from Ti is:deposited on the surface of the graphite low-resistance layer formed on the uppermost surface:of the n-type diamond thin-film layer 22 and an electrode 28 formed from Ti is deposited on the surface of the exposed p-type diamond thin-film layer 21 in order to obtain an ohmic contact (FIG. 3(f)). These electrodes 27, 28 are covered by depositing Pt, Au, etc., on them to prevent oxidation and improve their heat resistance. By means of these electrodes 27, 28, current flows from the electrode 28, through the p-type diamond thin-film layer 21, the n-type diamond thin-film layer 22 and the graphite low-resistance layer to the electrode 27.

Figure 4:
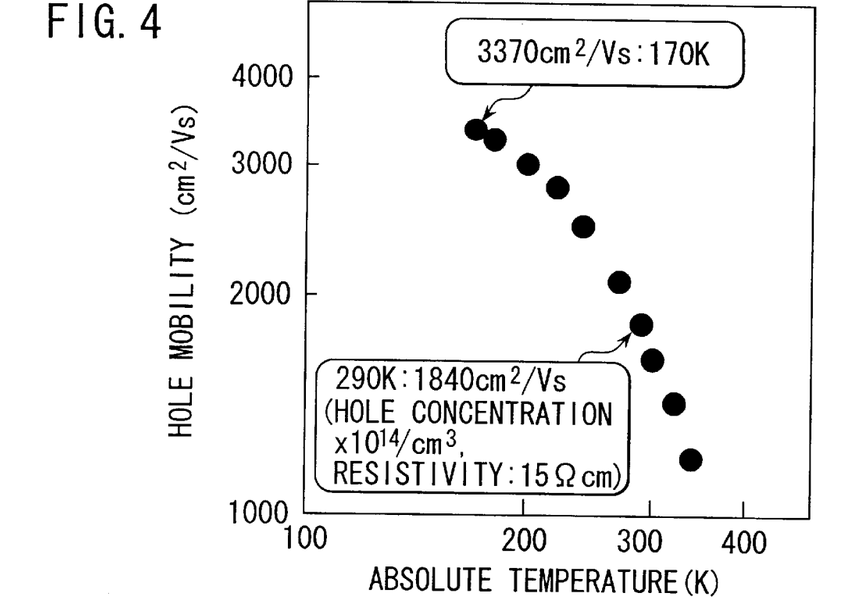
FIG. 4 is a graph showing the results of hole measurements of a p-type diamond thin film fabricated under the same conditions as the p-type diamond thin-film layer of the first embodiment.
Figure 5:
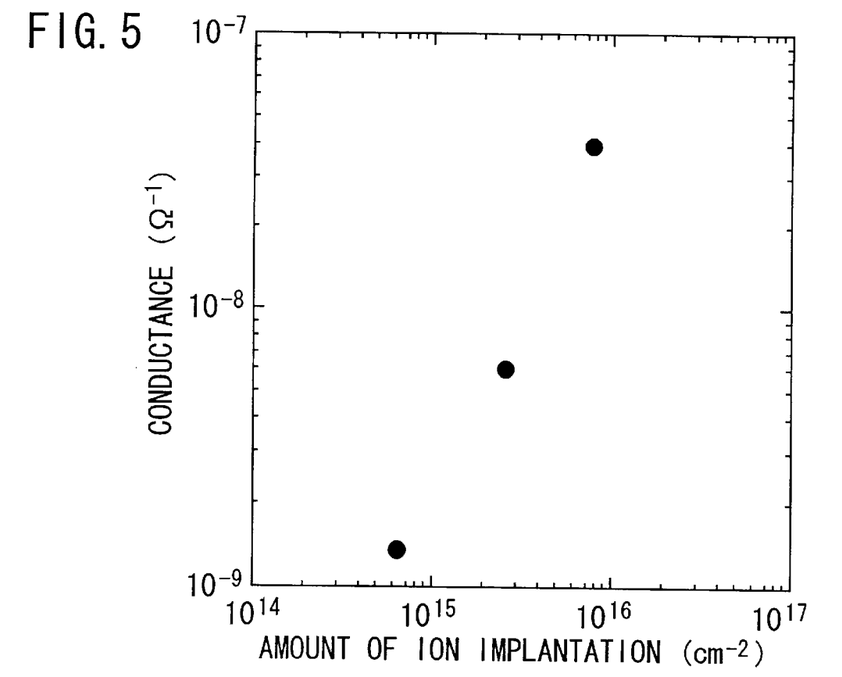
FIG. 5 is a graph showing the relationship between the amount of ion implantation and the electrical resistivity of an n-type diamond thin film fabricated under the same conditions as the n-type diamond thin-film layer of the first embodiment.
Figure 6:
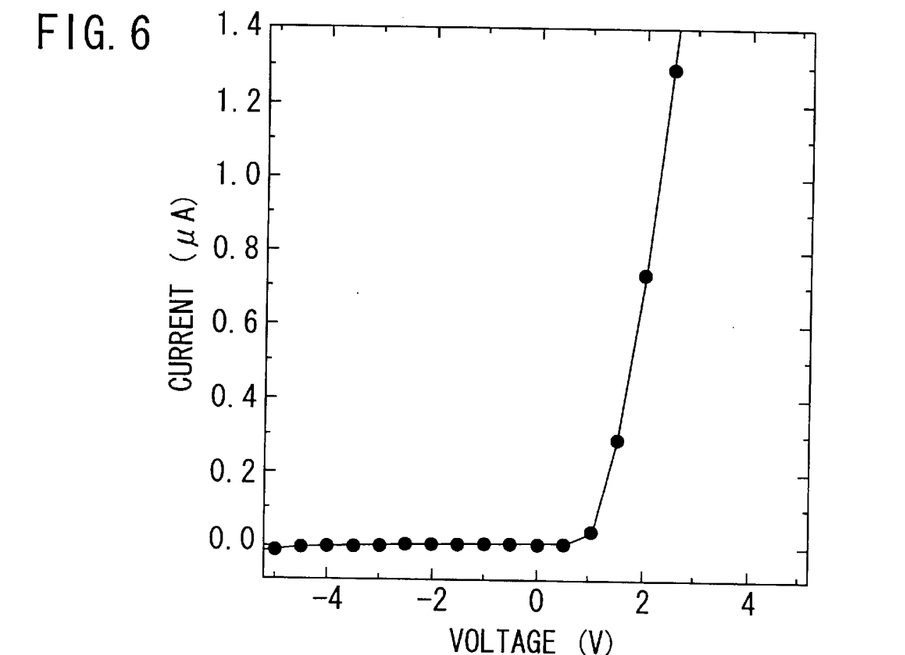
FIG. 6 is a graph showing the current-voltage characteristic of a diamond pn junction diode fabricated according to the fabrication process of the first embodiment.
Figure 7:
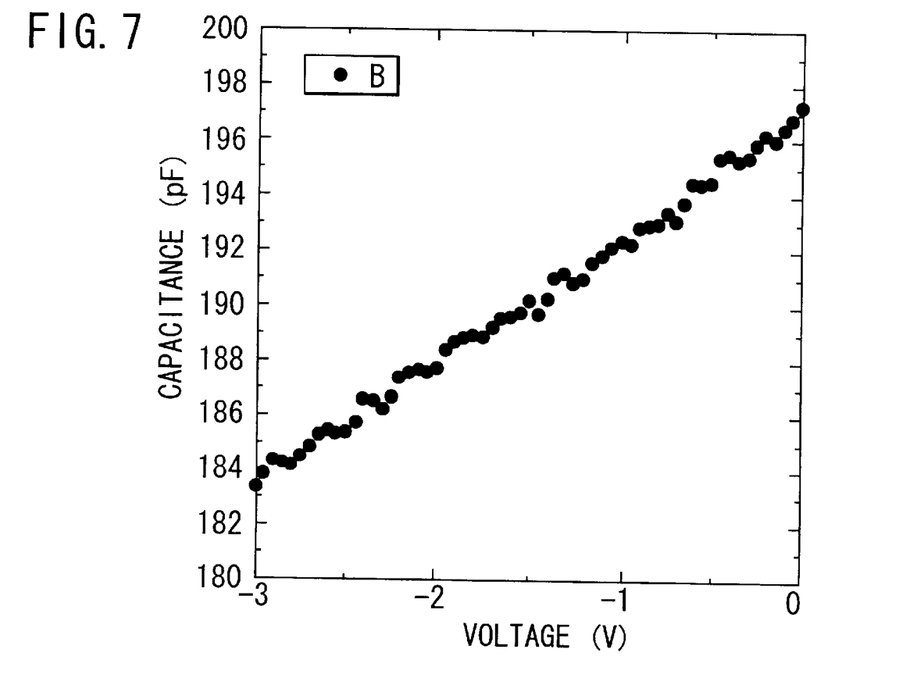
FIG. 7 is a graph showing the capacitance-voltage characteristic of a diamond pn junction diode fabricated according to the fabrication process of the first embodiment.

In the diamond pn junction diode 20 configured as described above, the characteristics evaluation of the p-type diamond thin-film layer 21 is explained using FIG. 4, the characteristics evaluation of the n-type diamond thin-film layer 22 is explained using FIG. 5, and the characteristics evaluation of the diamond pn junction diode 20 itself is explained using FIG. 6 and FIG. 7.

FIG. 4 is a graph showing the results of a Hall measurement of a p-type diamond thin-film fabricated under the same conditions as the p-type diamond thin-film layer 21 described above. As shown in the graph, in a p-type diamond thin film with a hole concentration of $2 \times 10^{14}$ cm$^3$ and an electrical resistivity of 15 Ωcm, the hole mobility exceeded 1800 cm$^2$/Vs at room temperature and 3000 cm$^2$/Vs at a low temperature of 170 K. This is an indication of the high-performance p-type diamond thin-film layer we were able to achieve by boron doping of a high-quality diamond; thin-film accompanying the exciton luminescence shown in FIG. 2.

FIG. 5 is a graph showing the relationship between the conductance (electrical resistivity) and amount of ion implantation in an n-type diamond thin-film fabricated under the same conditions as the n-type diamond thin-film layer 22 described above. From this figure, we can see that in the ion implantation of sulfur on the undoped diamond thin-film layer 22i the resistance of the undoped diamond thin-film layer 22i decreases as the amount of ion implantation is increased, thus making it possible to control the conductivity by the amount of ion implantation.

FIG. 6 is a graph showing the current-voltage characteristic of the diamond pn junction diode 20. In the region in which the voltage is positive in the graph, the electrode 28 on the p side is maintained positive and the electrode 27 on the n side is maintained negative, at which time the current flows in the forward direction. Also, in the region in the graph in which the voltage is negative, the electrode 28 on the p side is maintained negative and the electrode 27 on the n side is maintained positive, at which time the current flows in the reverse direction and is interrupted. That is, the diamond pn junction diode 20 demonstrates a marked rectifying action wherein in the forward direction, current nearly matching the current value determined by the bulk resistance of the diamond flows and the gate goes to an open condition, while in the reverse direction a resistance which is higher than the bulk resistance is formed by the depletion layer generated in the pn junction and the gate goes to a closed condition. As far as we know, this is the first time anyone has been able to get a pn junction to demonstrate this kind of marked rectifying characteristic using synthetic CVD diamond and an ion implantation method.

FIG. 7 is a graph showing the capacitance-voltage characteristic of the diamond pn junction diode 20. In the region in the graph in which the voltage is negative, the electrode 28 on the p side is maintained negative and the electrode 27 on the n side is maintained positive, at which time the direction is reversed and capacitance is achieved by the depletion layer generated in the pn junction. As the absolute value of the reverse-direction voltage becomes smaller, the depletion layer becomes smaller and the capacitance increases. This example demonstrates directly that a pn junction diode is obtained.

In the diamond pn junction diode 20 obtained by the fabrication process described in the first embodiment, the electrode 28 is formed directly on the p-type diamond thin-film layer 21 rather than via a substrate, and therefore a good electric contact can be maintained. Further, since the electrode 27 is formed on a graphite low-resistance layer, a good ohmic contact with the electrode 27 can be maintained. Also, since the electrodes 27, 28 are formed on the lamination surface on the substrate 11 and no electrodes are formed on the back of the substrate 11, the substrate 11 does not have to be made from a conductive material, thus making it possible to select a material that optimally matches the diamond thin-film layer formed on the substrate from a wider range of materials. Since the: undoped diamond thin-film layer 22i remains on the periphery of the n-type diamond thin-film layer 22, the pn junction interface does not extend to the peripheral surface, thus ensuring that any current leakage from the junction interface when current is passed between the electrodes 27, 28 is stopped by the undoped diamond thin-film layer 22i and electrical efficiency is improved. Restrictions on the placement of electrodes are also eliminated, thus improving the freedom of design so that an optimal design can be achieved in the electronic device.

In the above explanation, the electrode 28 was formed directly on the surface of the p-type diamond thin-film layer 21, but as in the case of the n-type diamond thin-film layer 22, a graphite low-resistance layer can be formed on this p-type diamond thin-film layer 21 and the electrode 28 formed on this graphite low-resistance layer. This will allow realization of a better ohmic contact with the electrode 28.

Figure 8:
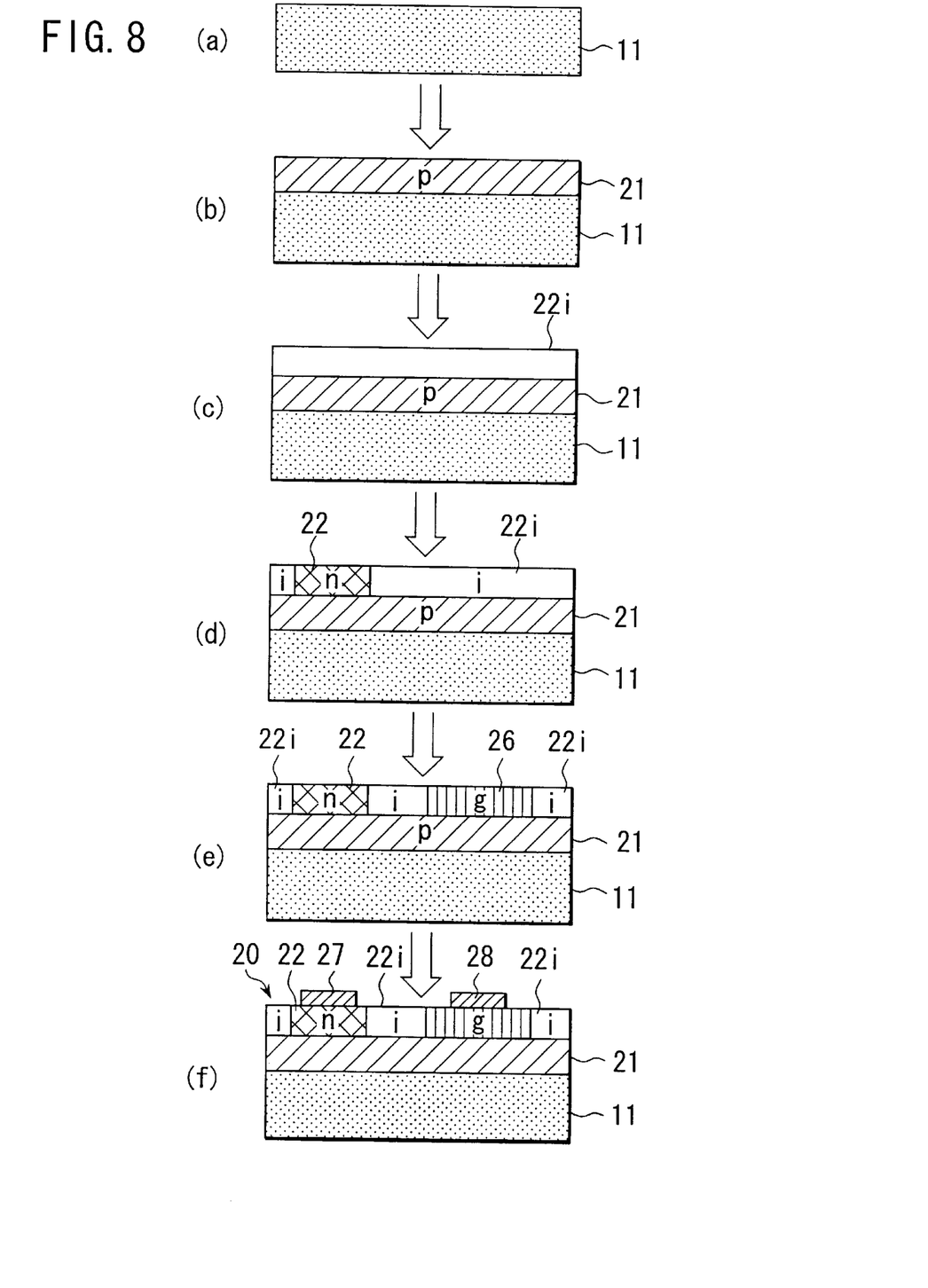
FIG. 8 is a drawing showing the second embodiment of the fabrication process of the diamond pn junction diode of this invention.

FIG. 8 is a drawing showing the second embodiment of the fabrication process of the diamond pn junction diode of this invention. In the fabrication process of this second embodiment, step (11) (FIG. 8(a)) and step (12) (FIG. 8(b)) are the same as step (1) and step (2) in the first embodiment, and therefore the process will be explained from step (13) here.

In step (13), the undoped diamond thin-film layer 22i is synthesized over the entire p-type diamond thin-film layer 21. The synthesis conditions are the same as in the method described above (FIG. 8(c)).

In step (14), an area of the undoped diamond thin-film layer 22i offset from the center toward one side up to the uppermost surface is implanted with sulfur ions while leaving the periphery of the undoped diamond thin-film layer 22i alone (FIG. 8(d)). This ion implantation up to the uppermost surface can be achieved in principle by suppressing the acceleration voltage to a low level. The sulfur ion implantation makes the entire undoped diamond thin-film layer 22i an n-type diamond thin-film layer 22 and forms a pn junction between this layer 22 and the p-type diamond thin-film layer 21 below it (FIG. 8(d). The implantation of sulfur ions was performed according to the method described above. Also, a suitable ohmic characteristic is maintained in the uppermost surface of the n-type diamond thin-film layer 22 by this sulfur ion implantation.

In step (15), an area of the remaining undoped diamond thin-film layer 22i offset from the center toward the opposite side is subjected to ion implantation with carbon, sulfur, argon, xenon, etc., to change the undoped diamond thin-film layer 22i to a graphite low-resistance layer 26 and achieve an ohmic contact between this layer and the p-type diamond thin-film layer 21 below it (FIG. 8(e)).

In step (16), the electrodes 27, 28 made from Ti are deposited on the respective surfaces of the n-type diamond thin-film layer 22 and the graphite low-resistance layer 26 to achieve ohmic contact (FIG. 8(f)). By means of these electrodes 27, 28, current flows from the electrode 28, through the graphite low-resistance layer 26, the p-type diamond thin-film layer 21 and the n-type diamond thin-film layer 22 to the electrode 27.

In the fabrication process in this second embodiment, as in the first embodiment described above, the electrode 28 is formed on the p-type diamond thin-film layer 21 rather than via the substrate, thus making it possible to maintain a good electrical contact. Further, since the electrode 28 is formed on the graphite low-resistance layer 26, it is possible to maintain an even better ohmic contact with the electrode 28. Also, since the electrodes 27, 28 are formed on the laminated surface of the substrate 11 and there are no electrodes on the backside of the substrate 11, the substrate 11 does not have to be conductive, thus making it possible to select a material that optimally matches the diamond thin-film layer formed on the substrate from a wider range of materials. Since the undoped diamond thin-film layer 22i remains on the periphery of the n-type diamond thin-film layer 22, the pn junction interface does not extend to the peripheral surface, thus ensuring that any current leakage from the junction interface when current is passed between the electrodes 27, 28 is stopped by the undoped diamond thin-film layer 22i and electrical efficiency is improved. Restrictions on the placement of electrodes are also eliminated, thus improving the freedom of design so that an optimal design can be achieved in the electronic device.

Figure 9:
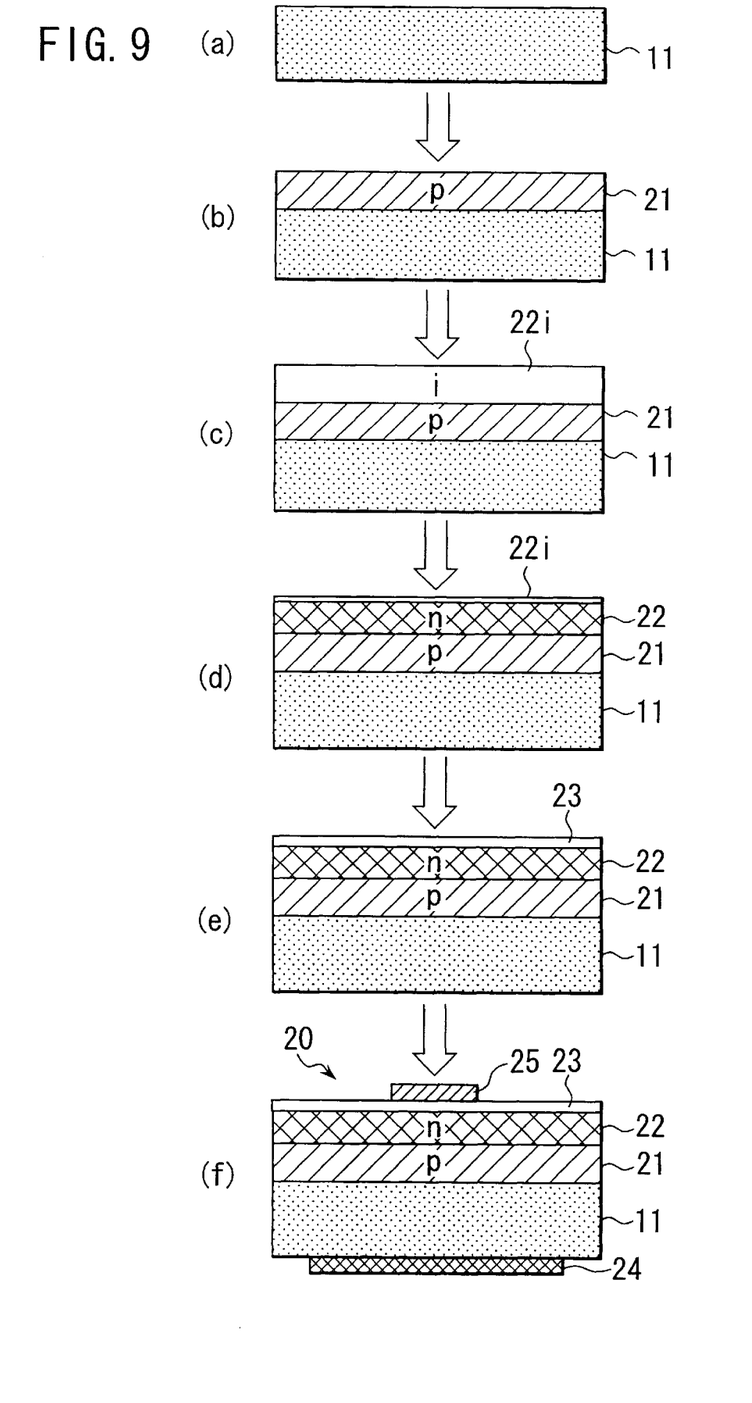
FIG. 9 is a drawing showing the third embodiment of the fabrication process of the diamond pn junction diode of this invention.

FIG. 9 is a drawing showing the third embodiment of the fabrication process of the diamond pn junction diode of this invention. In the fabrication process of this third embodiment, step (21) (FIG. 9(a)), step (22) (FIG. 9(b)) and step (23) (FIG. 9(c)) are the same as step (11) to step (13) in the second embodiment described above, and therefore the process will be explained from step (24) here. In the first and second embodiments described above, an insulating material was used as the substrate 11, but in the third to the fifth embodiments a p-type conductive substrate that has been doped with boron to a high concentration is used and an electrode is provided on the backside of the conductive substrate to make a sandwich type pn junction diode with electrodes on both sides.

In step (24), an ion implantation method is used to implant sulfur (S) on the undoped diamond thin-film layer 22i by multiple ion implantation until it reaches the interface with the p-type diamond thin-film layer 21, thus forming the n-type diamond thin-film layer 22 and making the diamond pn junction 20 on the substrate 11 (FIG. 9(d)). At this stage, the undoped diamond thin-film layer 22i remains as a shallow insulative layer on the surface of the n-type diamond thin-film layer 22.

In step (25), the undoped diamond thin-film layer 22i remaining as a thin layer on the surface is ion implanted with carbon, sulfur, argon, xenon, etc., to form the graphite low-resistance layer 23, thus achieving an ohmic contact with the n-type diamond thin-film layer 22 (FIG. 9(e)).

In step (26), electrodes 24, 25 made from titanium (Ti) are deposited on the backside of the substrate 11 and the surface of a graphite low-resistance layer 23, respectively, in order to obtain an ohmic contact (FIG. 9(f)).

Figure 10:
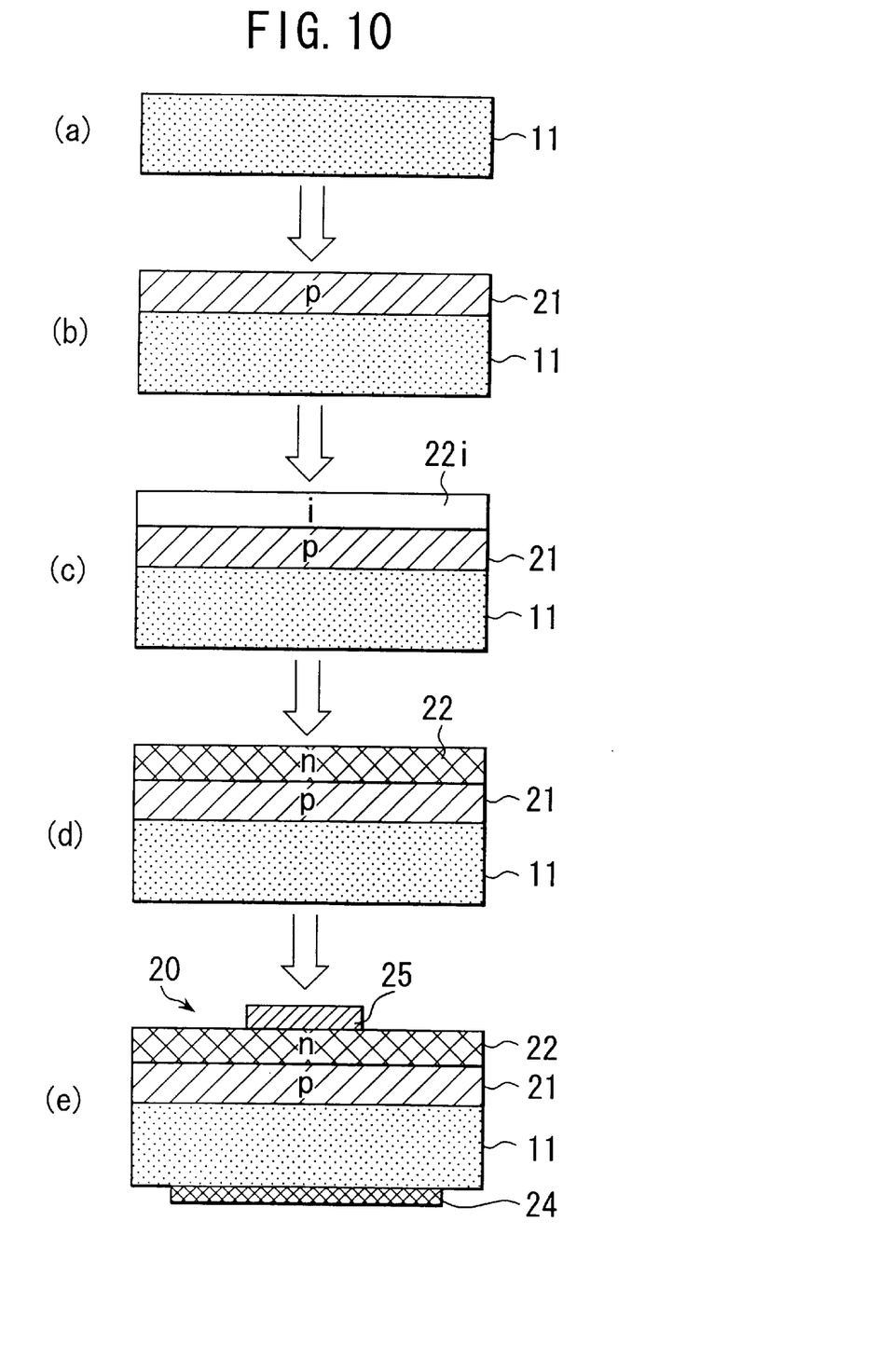
FIG. 10 is a drawing showing the fourth embodiment of the fabrication process of the diamond pn junction diode of this invention.

FIG. 10 is a drawing showing the fourth embodiment of the fabrication process of the diamond pn junction diode of this invention. In the fabrication process of this fourth embodiment, step (31) FIG. 10(a)), step (32) (FIG. 10(b)) and step (33) (FIG. 10(c)) are the same as step (11) through step (13) in the second embodiment described above, and therefore the process will be explained from step (34) here.

In step (34), sulfur ion implantation of the undoped diamond thin-film layer 22i is performed up to the uppermost surface of the undoped diamond thin-film layer 22i (FIG. 10(d)). Ion implantation of the uppermost surface can be achieved, in principle, by suppressing the acceleration voltage, and by means of this sulfur ion implantation the entire undoped diamond thin-film layer 22i becomes an n-type diamond thin-film layer 22 which forms a pn junction with the p-type diamond thin-film layer 21 below it. Also, a suitable ohmic characteristic is maintained in uppermost surface.

In step (35), as in the third embodiment, the electrodes 24, 25 made from Ti are deposited on the backside of the substrate 11 and on the surface of the n-type diamond thin-film layer 22, respectively (FIG. 10(e)).

As described above, in the fabrication process of the fourth embodiment, the process that forms a graphite low-resistance layer by means of implantation of carbon, sulfur, argon, xenon, etc., in the third embodiment (step (25) in the third embodiment) can be omitted, and therefore the fabrication process can be simplified.

Figure 11:
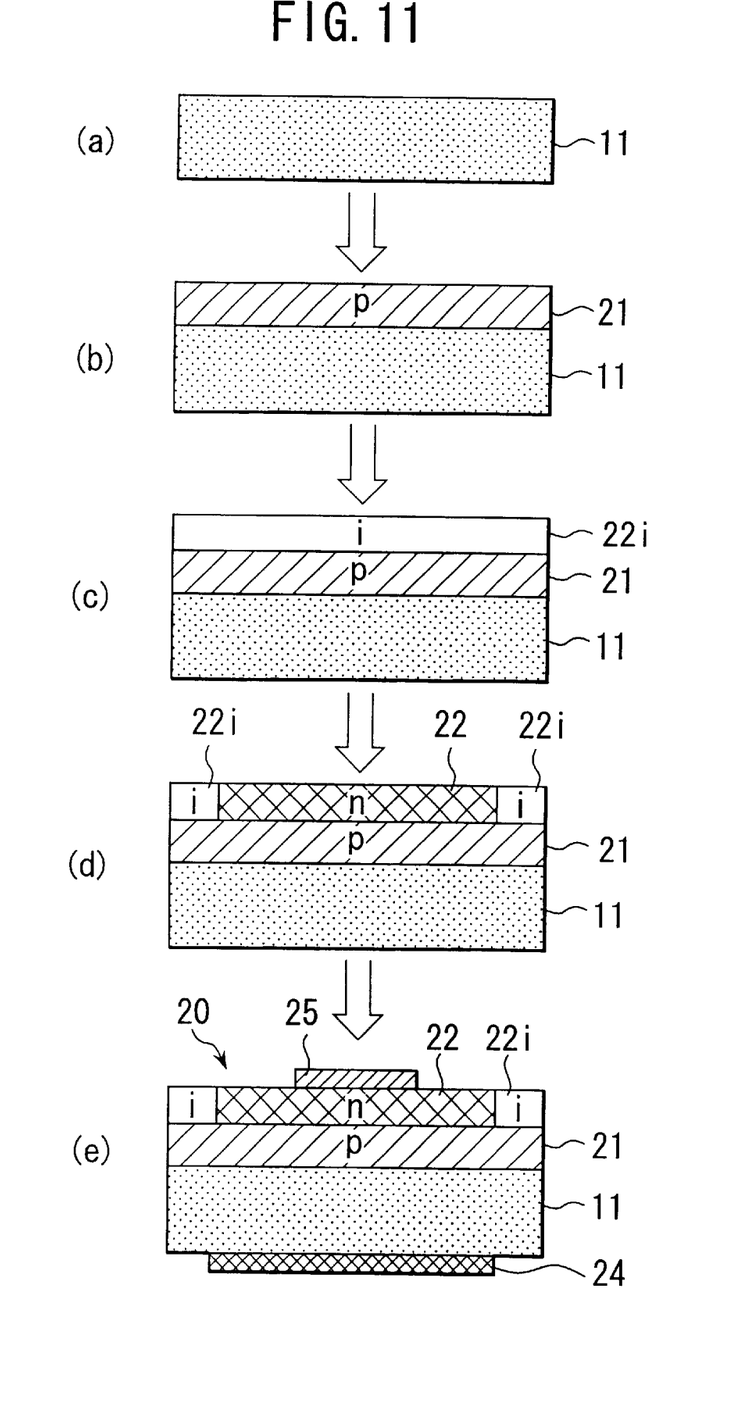
FIG. 11 is a drawing showing the fifth embodiment of the fabrication process of the diamond pn junction diode of this invention.

FIG. 11 is a drawing showing the fifth embodiment of the fabrication process of the diamond pn junction diode of this invention. In the fabrication process of this fifth embodiment, step (41) (FIG. 11(a)), step (42) (FIG. 11(b)) and step (43) (FIG. 11(c)) are the same as step (11) through step (13) in the second embodiment described above, and therefore the process will be explained from step (44) here.

In step (44), the middle part of the undoped diamond thin-film layer 22i is implanted with sulfur ions leaving the periphery of the undoped diamond thin-film layer 22i alone, thus forming an n-type diamond thin-film layer 22 in the middle area and a pn junction with the p-type diamond thin-film layer 21 below it (FIG. 11(d)). Also, the undoped diamond thin-film layer 22i is left in the periphery. A suitable ohmic characteristic is maintained in the uppermost surface of the n-type diamond thin-film layer 22.

In step (45), the electrodes 24, 25 made from Ti are deposited on the backside of the substrate 11 and the surface of the n-type diamond thin-film layer 22, respectively, to obtain an ohmic contact (FIG. 11(e)).

As described above, in the fabrication process of the fifth embodiment, the undoped diamond thin-film layer 22i is left on the periphery of the n-type diamond thin-film layer 22 as in the first and second embodiments described above such that the pn junction interface does not extend to the peripheral surface, and therefore any current leakage from the junction interface when current is passed between the electrodes 24, 25 is completely stopped by the undoped diamond thin-film layer 22i, which further improves electrical efficiency.

In the fabrication processes in the third to the fifth embodiments described above, a p-type substrate doped with boron to a high concentration was used as the substrate 11, but in this case the hole concentration of the p-type diamond thin-film layer 21 formed on the substrate 11 is set lower than the hole concentration of the substrate 11 such that current can be passed quickly from the electrode 24 on the substrate side to the electrode 25 on the side of graphite low-resistance layer 23.

As a result of measuring the current-voltage characteristic and capacitance-voltage characteristic when current was passed between the electrodes of the diamond pn junction diodes 20 formed according to the fabrication processes in the second to the fifth embodiments described above, we confirmed that a pn junction was reliably formed in all the diamond pn junction diodes 20 of second to the fifth embodiments.

In each of the fabrication processes of the first to the fifth embodiments described above, the p-type diamond thin-film layer 21 on the substrate 11 was formed by using a CVD method wherein impurities were doped under a gas phase during gaseous phase synthesis, but this p-type diamond thin-film layer 21 can be configured by first forming a high quality undoped diamond thin-film layer on the substrate 11 and then ion implantation of an impurity on this undoped diamond thin-film layer.

In each of the fabrication processes of the first and the fifth embodiments described above, a p-type diamond thin-film layer 21 was formed on the substrate 11 and an n-type diamond thin-film layer 22 was formed on that p-type diamond thin-film layer 21, but this can be reversed by forming the n-type diamond thin-film layer on the substrate and forming the high-quality undoped diamond thin-film layer on the n-type diamond thin-film layer after which the high-quality undoped diamond thin-film layer is converted to a p-type diamond thin-film layer by ion implantation of an impurity. The lower n-type diamond thin-film layer in this case may be formed by doping with an impurity using a CVD method or by forming a high-quality undoped diamond thin-film on the substrate and making the undoped diamond thin-film layer an n-type layer by ion implantation of an impurity.

As described above, when an n-type diamond thin-film layer is first formed on the substrate, an n-type substrate is used as the substrate and the electron density of the n-type diamond thin-film layer formed on the substrate is set lower than the electron density of the substrate. By using higher and lower electron densities, current can be passed more quickly from the top side electrode to the electrode on the substrate side. However, as in the case of the fabrication processes of the first and second embodiments described above, when electrodes are disposed only on the top side, no consideration has to be made for the electrical conductivity of the substrate or the electron densities of the substrate and the n-type diamond thin-film formed on the substrate.

When electrodes are disposed on the p-type diamond thin-film layer 21 and the graphite low-resistance layer on the n-type diamond thin-film layer 22, no restrictions are placed on the thin-film layers 21, 22 by the fabrication method; for example, they may be thin-film layers formed by doping with an impurity using a CVD method, or they may be a thin-film layer formed by first forming a high-quality undoped diamond thin-film layer on the substrate and then performing ion implantation of an impurity on this undoped diamond thin-film layer.

Further, in the above explanation, the n-type diamond thin-film layer was fabricated by ion implantation using sulfur (group VI) as the impurity element, but when forming an n-type layer, phosphorus (group V), lithium (group I), sodium (group I), bromine (group VII), iodine (group VII), etc., can also be used as the impurity element, or when using ion implantation to form the p-type layer, boron (group III), silicon (group IV), etc., can be used as the impurity element; i.e., elements from nearly all the groups can be used as impurity elements to control the electrical conductivity depending on the impurity element. Also, the impurity element is not limited to one type, but rather two or more types can be implanted.

As was explained above, by means of the diamond pn junction diode and its fabrication method of this invention, we were able to use ion implantation to reliably control electrical conductivity of diamond, which had not been realized in the prior art, by ion implantation of an impurity on a high-quality undoped diamond thin-film layer, and we were able to join diamond thin-film layers that demonstrated marked p-type and n-type characteristics by means of this electrical conductivity control, thus making it possible to reliably fabricate a diamond pn junction diode which had not been realized in the prior art. Therefore, we were able to take a critical step in utilizing diamond as an electronic device in future applications.

In other words, the pn junction of diamond demonstrates the ultimate properties of wide-band gap semiconductor, and this diamond pn junction diode will likely be used as a fundamental component of electronic devices that operate stably under severe conditions of high-temperature, .radiation, high-voltage, high frequency, etc., which conventional silicon and other semiconductor materials could not withstand; for example, electronic devices that operate in space, sensors inside nuclear reactors, and in applications in high vibration apparatus. Further, the pn junction can be used as the basic configuration for optical elements, or it can be used as a photo receptor for light with wavelengths shorter than ultraviolet light (x-ray, radiation).

What is claimed is:

1. A method of fabricating a diamond pn junction diode, comprising the steps of:

forming a p-type diamond thin-film layer on a substrate;

forming a high-quality undoped diamond thin-film layer on said p-type diamond thin-film layer; and making said high-quality undoped diamond thin-film layer an n-type diamond thin-film layer by ion implantation of an impurity.

2. A method of fabricating a diamond pn junction diode, comprising the steps of:

forming an n-type diamond thin-film layer on a substrate;

forming a high-quality undoped diamond thin-film layer on said n-type diamond thin-film layer; and making said high-quality undoped diamond thin-film layer a p-type diamond thin-film layer by ion implantation of an impurity.

3. A diamond pn junction diode fabrication method according to claim 1, wherein said high-quality undoped diamond thin-film layer is of sufficiently high quality to emit ultraviolet light at room temperature by excitation with electron beams when a thickness of the film is at least 200 nm.

4. A diamond pn junction diode fabrication method according to claim 2, wherein said high-quality undoped diamond thin-film layer is of sufficiently high quality to emit ultraviolet light at room temperature by excitation with electron beams when a thickness of the film is at least 200 nm.

* * * * *

UNITED STATES PATENT AND TRADEMARK OFFICE
CERTIFICATE OF CORRECTION

PATENT NO. : 6,727,171 B2
DATED : April 27, 2004
INVENTOR(S) : Takeuchi et al.

It is certified that error appears in the above-identified patent and that said Letters Patent is hereby corrected as shown below:

Title page,
Item [75], Inventors, should read:
-- Daisuke Takeuchi, Tsukuba (JP); Hideyuki Watanabe, Tsukuba (JP);
Hideyo Okushi, Tsukuba (JP); Masataka Hasegawa, Tsukuba (JP); Masahiko Ogura, Tsukuba (JP); Naoto Kobayashi, Tsukuba (JP); Koji Kajimura, Tsukuba (JP);
Sadanori Yamanaka, Kawaguchi (JP) --.
Insert Item -- [73] Assignees: Agency of Industrial Science & Technology, Ministry of International Trade & Industry, Tokyo (JP); Japan Science and Technology Corporation, Saitama (JP) --.
Insert Item -- [74] *Attorney, Agent, or Firm* – Oblon, Spivak, McClelland, Maier & Neustadt. P.C. --.

Signed and Sealed this

Fourteenth Day of March, 2006

JON W. DUDAS
*Director of the United States Patent and Trademark Office*